(12) United States Patent
Kim et al.

(10) Patent No.: US 7,851,885 B2
(45) Date of Patent: Dec. 14, 2010

(54) METHODS AND SYSTEMS INVOLVING ELECTRICALLY PROGRAMMABLE FUSES

(75) Inventors: Deok-kee Kim, Bedford Hills, NY (US); Keith Kwong Hon Wong, Wappingers Falls, NY (US); Chih-Chao Yang, Glenmont, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 11/847,379

(22) Filed: Aug. 30, 2007

(65) Prior Publication Data

US 2010/0237460 A9    Sep. 23, 2010

Related U.S. Application Data

(63) Continuation-in-part of application No. 11/683,071, filed on Mar. 7, 2007, now Pat. No. 7,732,893.

(51) Int. Cl.
*H01L 21/82* (2006.01)

(52) U.S. Cl. .................. 257/529; 257/208; 257/209; 257/530; 438/132; 337/160

(58) Field of Classification Search .......... 257/529, 257/208, 209, 530, 525; 438/682–684, 128–132; 337/158–162
See application file for complete search history.

(56) References Cited

U.S. PATENT DOCUMENTS

| | | | |
|---|---|---|---|
| 4,914,055 A | 4/1990 | Gordon et al. | |
| 5,272,666 A | 12/1993 | Tsang et al. | |
| 5,412,593 A | 5/1995 | Magel et al. | |
| 5,621,691 A | 4/1997 | Park | |
| 5,903,041 A | 5/1999 | La Fleur et al. | |
| 5,969,404 A | 10/1999 | Bohr et al. | |
| 6,096,580 A | 8/2000 | Iyer et al. | |
| 6,323,534 B1 | 11/2001 | Marr et al. | |
| 6,323,535 B1 * | 11/2001 | Iyer et al. | 257/529 |
| 6,337,507 B1 * | 1/2002 | Bohr et al. | 257/529 |
| 6,346,846 B1 | 2/2002 | Bertin et al. | |
| 6,372,652 B1 | 4/2002 | Verma et al. | |
| 6,388,305 B1 | 5/2002 | Bertin et al. | |
| 6,396,120 B1 | 5/2002 | Bertin et al. | |

(Continued)

FOREIGN PATENT DOCUMENTS

WO    WO2004100271 A1    11/2004

(Continued)

OTHER PUBLICATIONS

Kothandaraman et al., "Electrically Programmable Fuse (eFUSE) Using Electromigration in Silicides," IEEE Electron Device Letters, vol. 23, No. 9, Sep. 2002.

*Primary Examiner*—Wael M Fahmy
*Assistant Examiner*—Mark W Tornow
(74) *Attorney, Agent, or Firm*—Cantor Colburn LLP; Ian MacKinnon

(57) ABSTRACT

An electrically programmable fuse comprising a cathode member, an anode member, and a link member, wherein the cathode member, the anode member, and the link member each comprise one of a plurality of materials operative to localize induced electromigration in the programmable fuse.

9 Claims, 5 Drawing Sheets

U.S. PATENT DOCUMENTS

| | | |
|---|---|---|
| 6,396,121 B1 | 5/2002 | Bertin et al. |
| 6,433,404 B1 * | 8/2002 | Iyer et al. .................. 257/529 |
| 6,498,056 B1 | 12/2002 | Motsiff et al. |
| 6,501,107 B1 | 12/2002 | Sinclair et al. |
| 6,507,087 B1 | 1/2003 | Yu |
| 6,512,284 B2 | 1/2003 | Schulte et al. |
| 6,570,207 B2 | 5/2003 | Hsu et al. |
| 6,577,156 B2 | 6/2003 | Anand et al. |
| 6,617,914 B1 | 9/2003 | Kothandaraman |
| 6,621,324 B2 | 9/2003 | Fifield et al. |
| 6,624,031 B2 | 9/2003 | Abadeer et al. |
| 6,624,499 B2 | 9/2003 | Kothandaraman et al. |
| 6,661,330 B1 | 12/2003 | Young |
| 6,750,530 B1 | 6/2004 | Klaasen et al. |
| 6,751,137 B2 | 6/2004 | Park et al. |
| 6,753,590 B2 | 6/2004 | Fifield et al. |
| 6,794,726 B2 | 9/2004 | Radens et al. |
| 6,853,049 B2 | 2/2005 | Herner |
| 6,879,021 B1 | 4/2005 | Fitfield et al. |
| 6,882,027 B2 | 4/2005 | Brintzinger et al. |
| 6,927,997 B2 | 8/2005 | Lee et al. |
| 6,944,054 B2 | 9/2005 | Rueckes et al. |
| 6,972,614 B2 | 12/2005 | Anderson, II et al. |
| 7,087,499 B2 | 8/2006 | Rankin et al. |
| 7,254,078 B1 | 8/2007 | Park et al. |
| 7,382,036 B2 | 6/2008 | Nowak et al. |
| 2004/0004268 A1 | 1/2004 | Brown et al. |
| 2004/0222491 A1 | 11/2004 | Ito et al. |
| 2005/0124097 A1 | 6/2005 | Xiang |
| 2005/0247997 A1 | 11/2005 | Chung et al. |
| 2005/0277232 A1 | 12/2005 | Wu et al. |
| 2006/0012458 A1 * | 1/2006 | Leigh et al. .................. 337/159 |
| 2006/0081959 A1 | 4/2006 | Dondero et al. |
| 2006/0102982 A1 | 5/2006 | Park et al. |
| 2006/0278932 A1 | 12/2006 | Kothandaraman et al. |
| 2007/0029576 A1 * | 2/2007 | Nowak et al. ............... 257/209 |
| 2007/0099326 A1 | 5/2007 | Hsu et al. |
| 2007/0205485 A1 | 9/2007 | Hsu et al. |
| 2007/0252237 A1 | 11/2007 | Ko et al. |
| 2008/0029844 A1 | 2/2008 | Adkisson et al. |
| 2008/0069629 A1 * | 3/2008 | Beuselinck et al. ........... 402/73 |
| 2008/0157201 A1 | 7/2008 | Marshall |
| 2008/0217733 A1 * | 9/2008 | Iyer et al. .................... 257/529 |

FOREIGN PATENT DOCUMENTS

| | | |
|---|---|---|
| WO | WO2006028946 A2 | 3/2006 |

* cited by examiner

METHODS AND SYSTEMS INVOLVING ELECTRICALLY PROGRAMMABLE FUSES

CROSS-REFERENCE TO RELATED APPLICATIONS

This is a continuation-in-part application of application Ser. No. 11/683,071, filed on Mar. 7, 2007 now U.S. Pat. No. 7,732,893.

BACKGROUND OF THE INVENTION

1. Field of the Invention

This invention relates to semiconductor fuses, and particularly to electrically programmable semiconductor fuses.

2. Description of Background

Before our invention, electrically programmable fuses (eFuses) used in re-routing circuits typically include polysilicon strips with a thin layer of silicide covering the top of the stripes. Passing current through the eFuse results in the electromigration of silicide material in the fuse. Electromigration refers the transport of material caused by the gradual movement of the ions in a conductor due to the momentum transfer between conducting electrons and diffusing metal atoms. The effect is more pronounced in applications where high direct current densities are used, such as in microelectronics and related structures. With respect to eFuse devices, electromigration results in a higher resistance in the eFuse, effectively making the eFuse act as an open circuit. Thus, a large current density is required to induce electromigration in these types of eFuses. The use of a large current may result in a rupture of the fuse link in the eFuse.

SUMMARY OF THE INVENTION

The shortcomings of the prior art are overcome and additional advantages are provided through the provision of an electrically programmable Efuse, comprising, a cathode member, an anode member, and a link member connecting the cathode member and the anode member, wherein the cathode member, the anode member, and the link member include at least two materials of different resistivities so as to promote faster electromigration at a selected region of the fuse with respect to other regions of the fuse.

An alternate exemplary embodiment of an electrically programmable fuse comprising a first layer of polysilicon disposed on a substrate defining an anode member, a link member, and a cathode member, and a second layer disposed on the first layer further defining the anode member, the link member and the cathode member, wherein the second layer comprises a first metal silicide and a second metal silicide.

An exemplary alternate embodiment of an electrically programmable fuse comprising an anode member comprising a first metal disposed on a substrate and a second metal disposed on the first metal, a cathode member comprising the first metal disposed on the substrate and the second metal disposed on the first metal, a link member comprising the first metal disposed on the substrate, and a notch portion defined in part by the second metal of the anode member, the second metal of the cathode member and the link member.

An exemplary alternate embodiment of an electrically programmable fuse comprising a first metal defining an anode member; and a second metal defining a link member and a cathode member, wherein the resistivities of the first and second metal are operative to induce electromigration in the first metal prior to the inducing electromigration in the second metal.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter, which is regarded as the invention, is particularly pointed out and distinctly claimed in the claims at the conclusion of the specification. The foregoing and other aspects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Systems and methods involving electrically programmable fuses are provided. Several exemplary embodiments are described.

In this regard, an electrically programmable fuse (eFuse) may be used to re-route circuits in semiconductors. For example, typical semiconductors include logic that is permanently etched on a chip. This logic cannot usually be changed once the chip is etched. However, eFuses may be used to dynamically reprogram semiconductor chips while they are in use.

Existing eFuses may include poly-silicon strips with a thin layer of silicide covering the top of the strips. Programming these eFuses requires passing a pulse of high current through the eFuse. The pulse of current induces a large gap in the conducting silicide layer caused by the electromigration of atoms in the metal. The gap in the conducting silicide layer may include an undesirable rupture in the fuse link portion of the eFuse. The resistance of the poly-silicon strip shifts from about 100 ohms to 1 kohm or greater, for example, in the programmed eFuse. The amount of resistance shift using this type of eFuse cannot be easily controlled because the programming process uses a large amount of power density in a short period of time (approximately 1 msec, for example).

Thus, it is desirable to reduce the amount of power density required to program an eFuse, such that the amount of resistance shift is more controllable, and a rupture of the fuse link portion of the eFuse may be prevented.

Figure 1A:
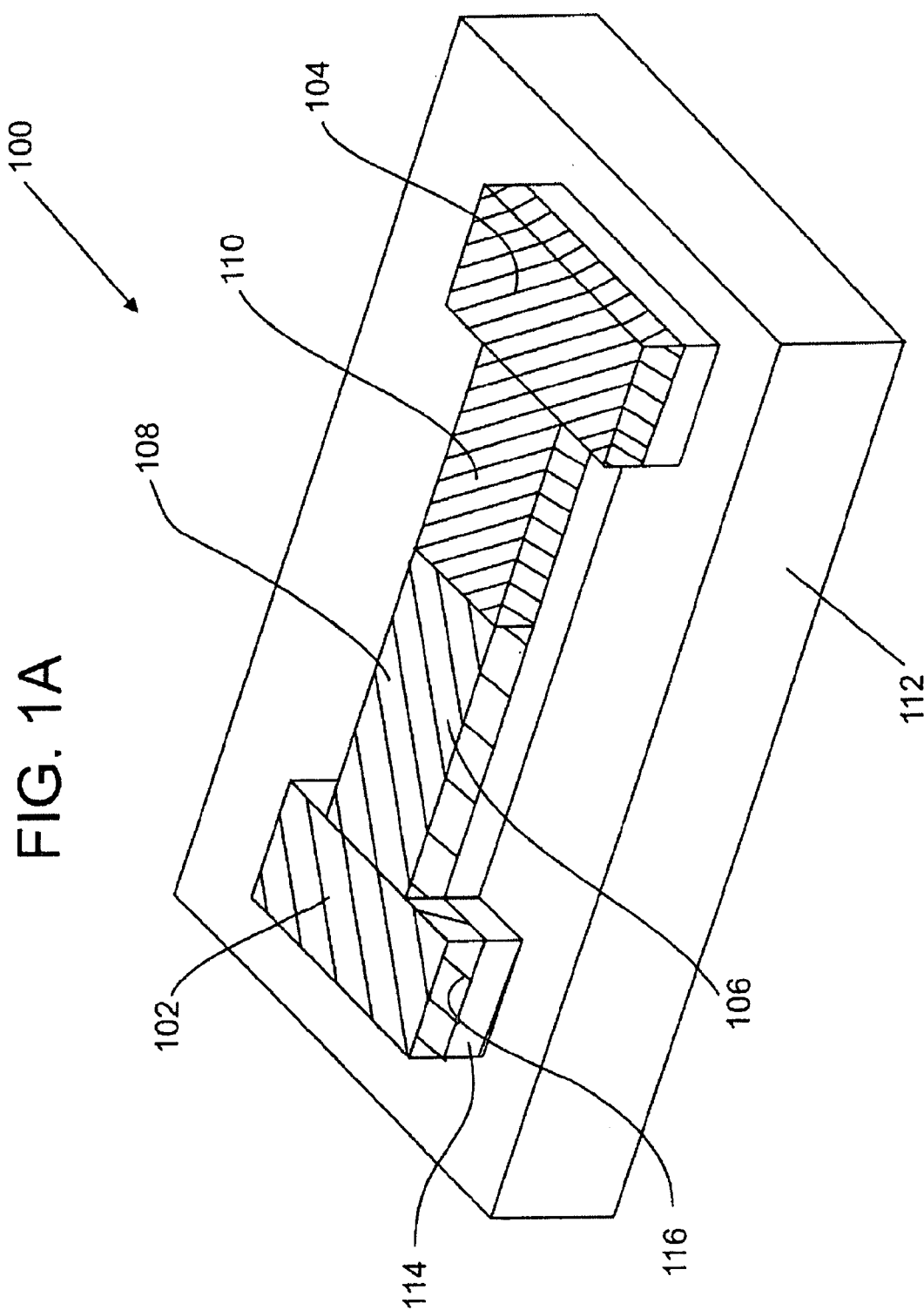
FIG. 1A illustrates a perspective view of one example of an eFuse.

FIG. 1A illustrates a perspective view of an exemplary embodiment of an eFuse. An eFuse 100 includes an anode member 102, a cathode member 104, and a link member 106 disposed on a substrate 112. Substrate 112 may include a dielectric material such as SiCOH, for example. The link member 106 includes an anode portion 108 and a cathode portion 110, and contacts the anode member 102 and the cathode member 104 at the distal ends of the link member 106.

In the illustrated embodiment, anode member 102, the cathode member 104, and the link member 106 each include two layers. The first (or lower) layer 114 is a polysilicon layer disposed on the substrate 112. The second (or upper) layer 116 is a metal silicide layer that includes two different types of metal silicides such as those selected from titanium, cobalt, nickel, platinum and tungsten, for example.

In the illustrated exemplary embodiment, the second layer 116 of the anode member 102 and the anode portion 108 of the link member 106 include a first type of metal silicide. The second layer 116 of the cathode member 104 and the cathode portion 110 of the link member 106 include of a second type of metal silicide.

In operation, an eFuse is programmed by inducing a current through the fuse member that causes electromigration of the atoms in the fuse member. The electromigration causes the resistively of the eFuse to increase. The effective result is that the programmed eFuse acts as an open circuit.

Electromigration may be determined by current density, temperature, and resistively of a material. Materials with higher resistively require less current density to induce electromigration. Thus, varying the resistivity of certain components of an eFuse allows less current density to be used to program the eFuse. Additionally, by locating materials of different resistivities in different areas of an eFuse, the location of the electromigration may be more easily controlled.

In this regard, referring to the eFuse 100 of FIG. 1A, for example, when current is passed from the cathode member 104 through the link member 106 to the anode member 102, the temperature of the eFuse increases. The combination of higher temperature and current flow causes electromigration in the eFuse 100. In the eFuse 100, the top layer 116 includes two types of metal silicides. The first metal silicide located in the cathode member 104 and the cathode portion 110 of the link member 106 has a lower resistivity than the second metal silicide located in the anode member 102 and the anode portion 108 of the link member 106. Thus, the current density for promoting electromigration in the anode portion 108 of the link member 106 is lower than the current density for promoting electromigration in the cathode portion 110. As a result, electromigration occurs earlier in the anode portion 108.

Figure 1B:
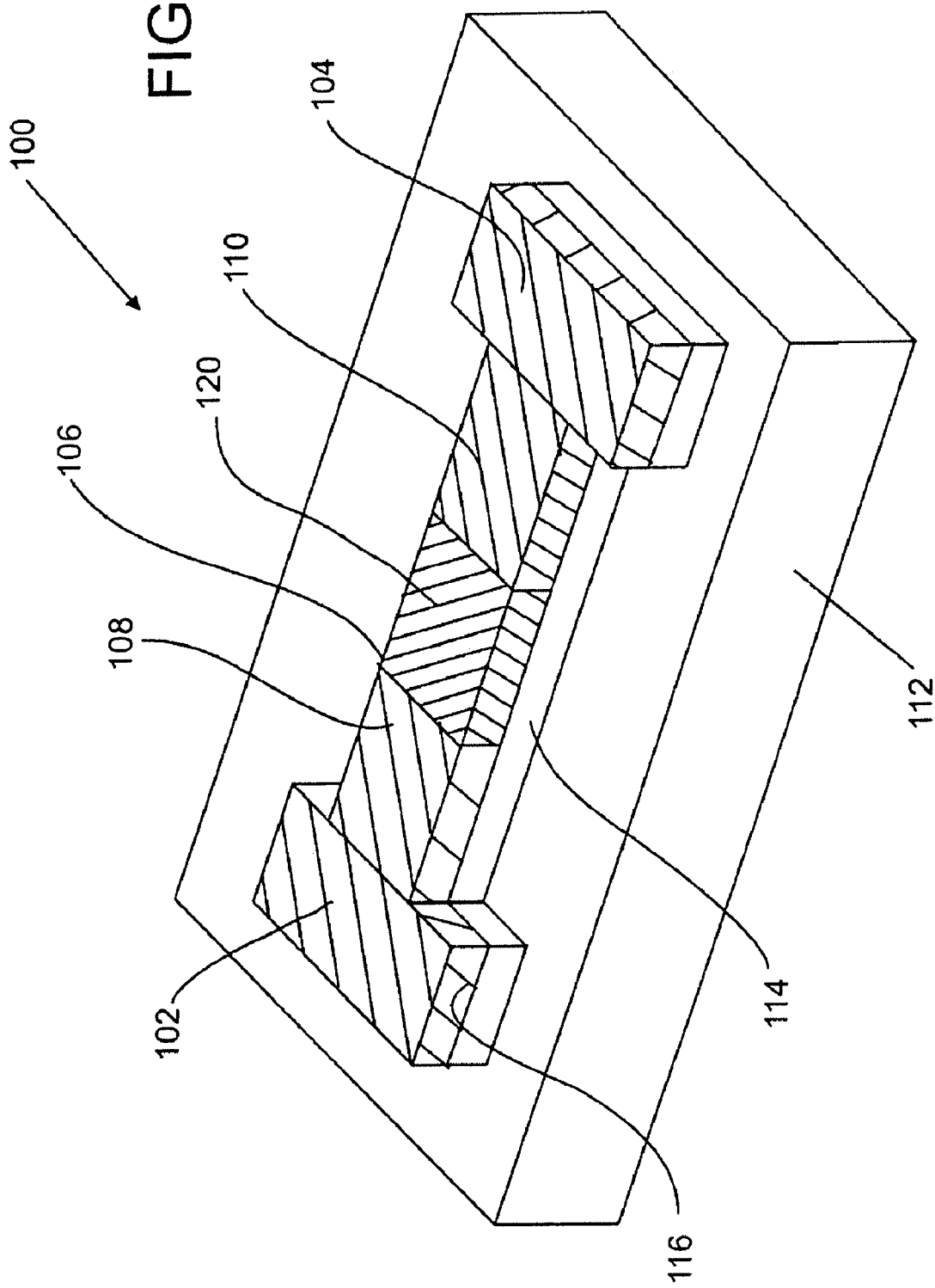
FIG. 1B illustrates a perspective view of an example of an alternate embodiment of an eFuse.

FIG. 1B illustrates a perspective view of an alternate exemplary embodiment of an eFuse 100. The illustrated embodiment includes an anode member 102 electrically connected to a cathode member 104 via a link member 106. The link member 106 includes an anode portion 108, a cathode portion 110, and a center portion 120. The eFuse 100 includes a first layer 114 that is a polysilicon material disposed on a dielectric substrate 112.

A second layer 116 includes two types of metal silicides. The second layer 116 of the anode member 102 and the cathode member 104 comprise of a first metal silicide. The second layer 116 of the anode portion 108 of the link member 106 and the second layer 116 of the cathode portion 110 of the link member 106 also comprise of the first metal silicide. The second layer 116 of the 106 center portion 120 of the link member includes a second metal silicide.

In operation, the center portion 120 of the eFuse 100 comprises a layer of metal silicide that has a higher resistivity than the other metal silicide portions of the eFuse 100. When a current is applied across the link member 106, the higher resistivity of the center portion 120 causes a higher temperature and a higher electromigration in the center portion 120 relative to the other portions of the eFuse 100. Thus, the electromigration in the eFuse 100 is localized in the center portion 120.

Figure 1C:
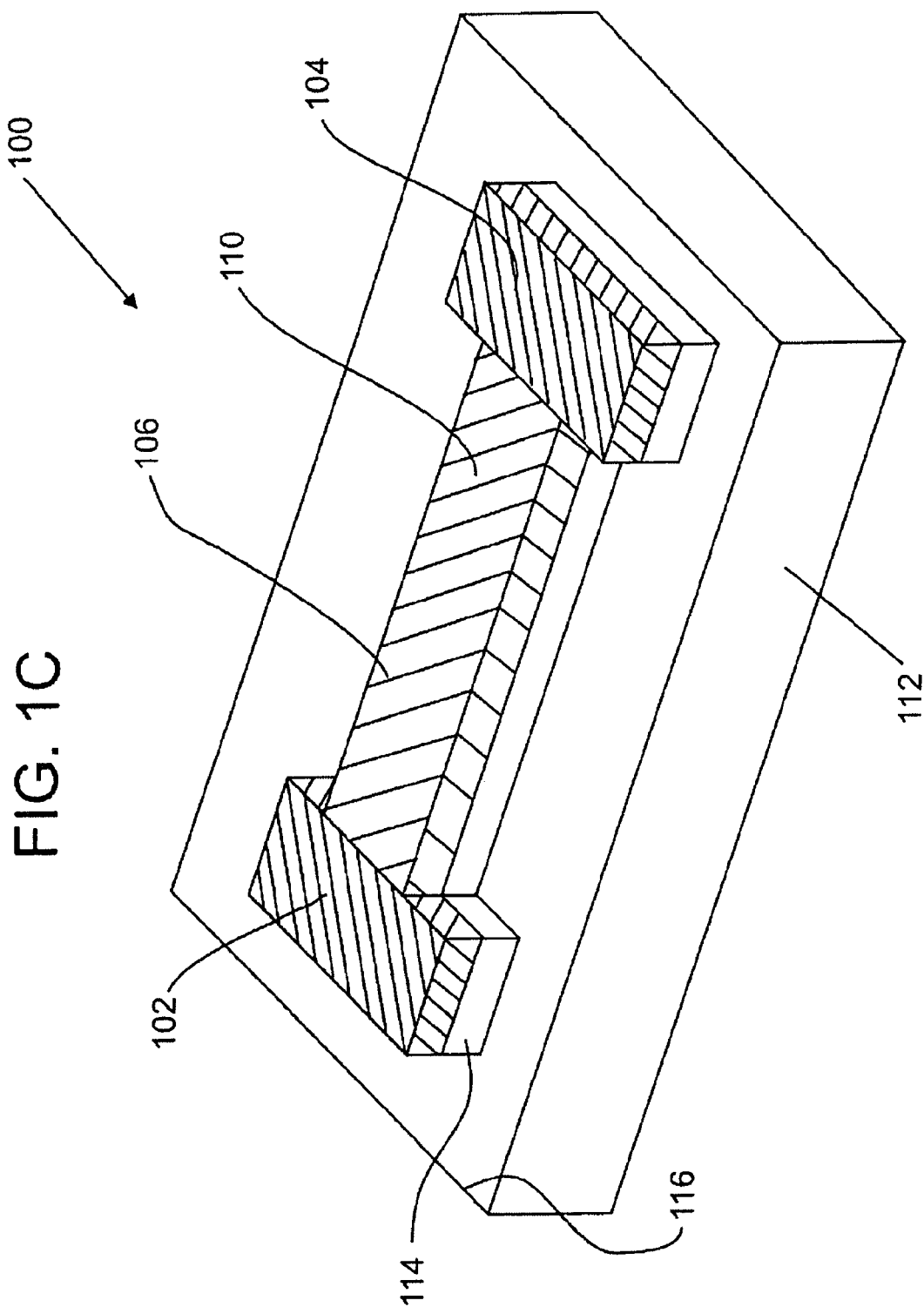
FIG. 1C illustrates a perspective view of an example of an alternate embodiment of an eFuse.

FIG. 1C illustrates an alternate embodiment of the eFuse 100, the anode member's 102 and cathode member's 104 second layers comprise a first metal silicide. The second layer 116 of the link member 106 comprises a second metal silicide.

In the illustrated alternate embodiment of eFuse 100 shown in FIG. 1C, the entire metal silicide layer of the link portion 106 comprises a metal silicide with a higher resistivity than the metal silicide layers of the cathode member 104 and the anode member 102. The relative difference in resistivities between the link member 106 and the cathode member 104 and anode member 106 results in electromigration occurring in the link member 106 prior to the cathode member 104 and the anode member 102.

Figure 2:
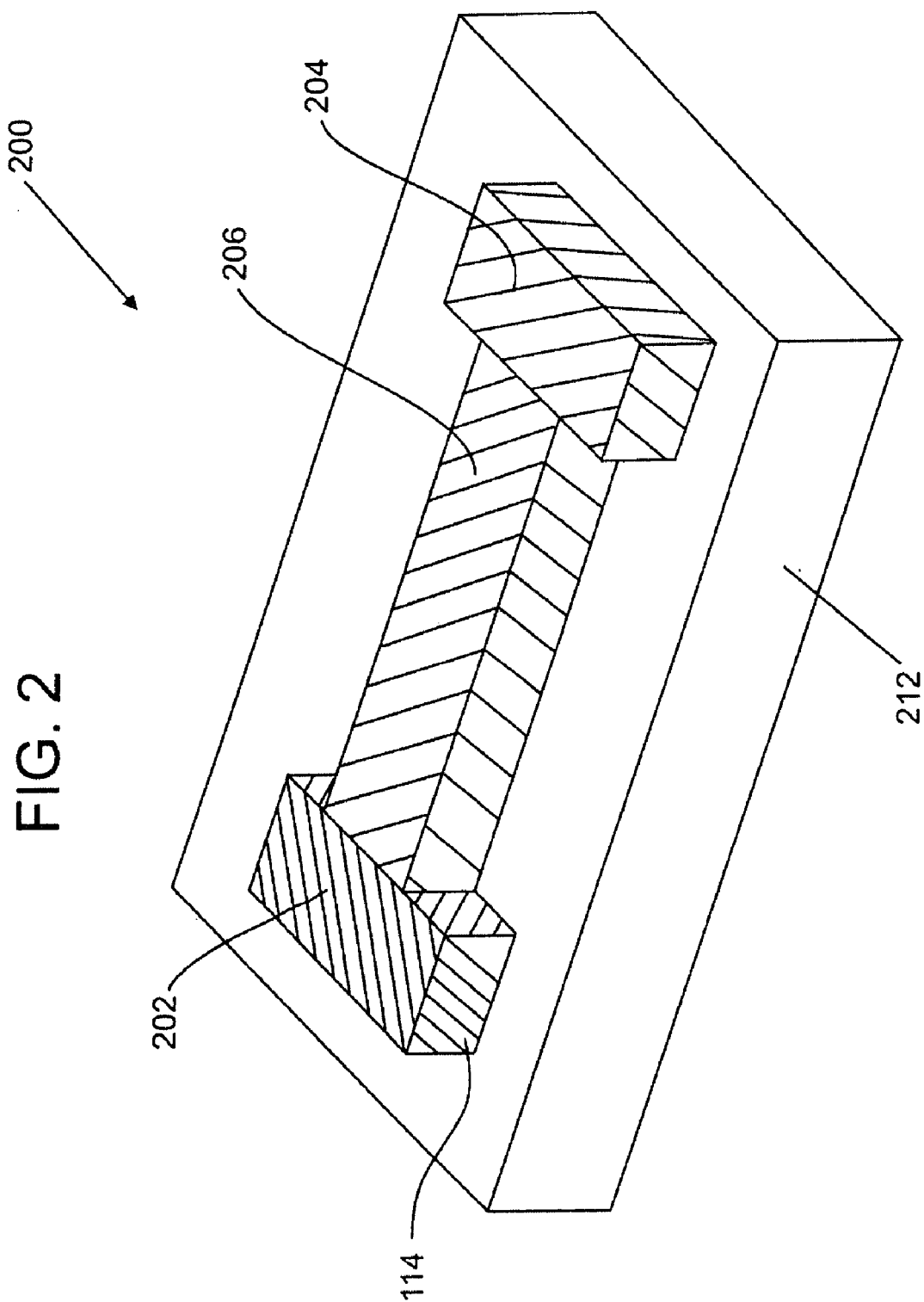
FIG. 2 illustrates a perspective view of an example of an alternate embodiment of an eFuse.

FIG. 2 illustrates another alternate embodiment of an eFuse 200. In the illustrated embodiment, an anode member 202, a link member 206, and a cathode member 204 are disposed on a dielectric substrate 212. The anode member 202 comprises a first metal, and the link member 206 and cathode member 204 comprises a second metal. The metals may be any of a variety of suitable metals including metal nitride and metal silicide, for example. The second metal has a higher resistivity relative to the first metal. Thus, electromigration occurs in the second metal prior to the first metal.

Figure 3:
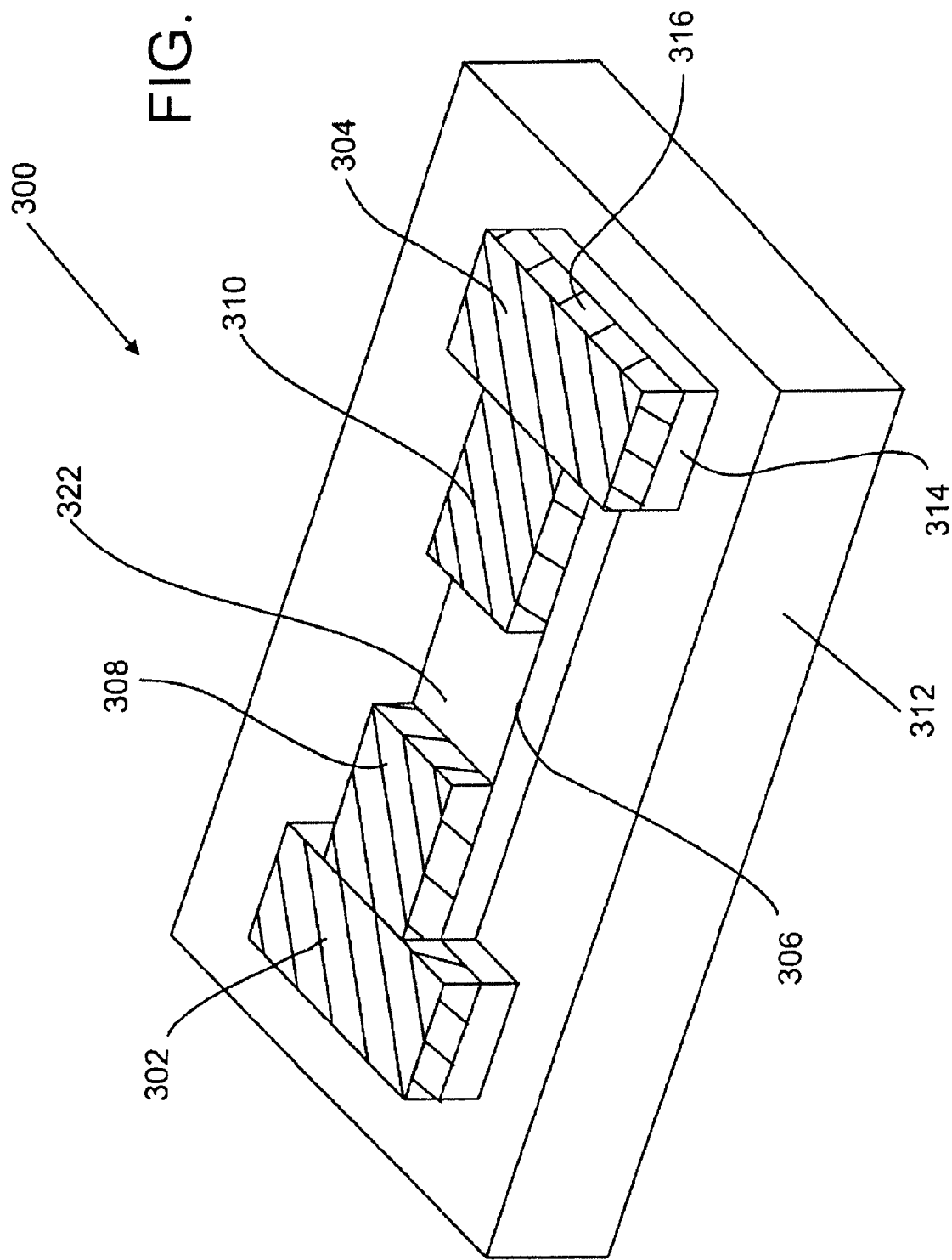
FIG. 3 illustrates a perspective view of an example of an alternate embodiment of an eFuse.

FIG. 3 illustrates an alternate embodiment of an eFuse 300. The illustrated embodiment includes an anode member 302, a link member 306, and a cathode member 304. The link member includes an anode portion 308, a notch portion 322, and a cathode portion 310.

The anode member 302, the link member 306, and the cathode member 304 include two layers. A first layer 314 is disposed on a substrate 312, and comprises a first metal. A second layer 316 is disposed on the first layer 314 and comprises a second metal. The first layer 314 of the link member 306, and the second layer 316 of the anode portion 308 and the cathode portion 310 of the link member 306 partially define the notch portion 322.

In operation, when current is induced across the link member 306, current must flow under the notch portion 322. Since the cross sectional area of the link member 306 is smaller under the notch portion 322 than the other portions of the link member 306, the current crowds under the notch portion 322. Thus, the effective resistivity of the area under the notch is greater than the other portions of the link member 306. The resultant electromigration occurs under the notch portion 322 prior to the other portions of the eFuse 300. This effect may be increased if the first and second metals have similar conductivities.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An electrically programmable Efuse, comprising:
   a cathode member;
   an anode member; and
   a link member connecting the cathode member and the anode member, wherein the cathode member, the anode member, and the link member include a polysilicon layer and a second layer disposed on the polysilicon layer;
   a first metal silicide defines the second layer of the anode member and the second layer of an anode portion of the link member and a second metal silicide defines the second layer of the cathode and a cathode portion of the link member, wherein the first metal silicide and the second metal silicide are different types of metal silicides.

2. The electrically programmable Efuse of claim 1, wherein a notch is defined in a center portion of the link member defined in part by the cathode portion of the link member, the polysilicon layer, and the anode portion of the link member.

3. The electrically programmable Efuse of claim 1, wherein the first metal silicide and the second metal silicide are selected from the group comprising:
   titanium;
   cobalt;
   nickel;
   platinum; and
   tungsten.

4. The electrically programmable Efuse of claim 1, wherein the first metal silicide is of a higher resistivity than the second metal silicide.

5. The electrically programmable Efuse of claim 1, wherein the second metal silicide is of a higher resistivity than the first metal silicide.

6. An electrically programmable fuse comprising:
   a first layer of polysilicon disposed on a substrate defining an anode member, a link member, and a cathode member; and
   a second layer disposed on the first layer further defining the anode member, the link member and the cathode member, wherein the second layer comprises a first metal silicide and a second metal silicide, the first metal silicide and the second metal silicide are different types of metal silicides.

7. The electrically programmable fuse of claim 6, wherein the second layer includes:
   the cathode member comprising the first metal silicide;
   a cathode portion comprising the first metal silicide;
   the anode member comprising the second metal silicide; and
   an anode portion comprising the second metal silicide.

8. The electrically programmable fuse of claim 6, wherein the second layer includes:
   the cathode member comprising the first metal silicide;
   a cathode portion comprising the first metal silicide;
   a center portion comprising the second metal silicide;
   the anode member comprising the first metal silicide; and
   an anode portion comprising the first metal silicide.

9. The electrically programmable fuse of claim 6, wherein the second layer includes:
   the cathode member comprising the first metal silicide;
   the link member comprising the second metal silicide; and
   the anode member comprising the first metal silicide.

* * * * *